United States Patent [19]
Siniscalchi

[11] Patent Number: 6,011,418
[45] Date of Patent: Jan. 4, 2000

[54] METHOD AND APPARATUS FOR TRIMMING A SIGNAL

[75] Inventor: Patrick P. Siniscalchi, Sachse, Tex.

[73] Assignee: Texas Instruments Incorporated, Dallas, Tex.

[21] Appl. No.: 08/988,545

[22] Filed: Dec. 10, 1997

[51] Int. Cl.$^7$ .............................. H03K 5/00; H03K 17/68
[52] U.S. Cl. ...................... 327/308; 327/553; 327/103; 327/362
[58] Field of Search ...................... 327/306, 308, 327/362, 378, 552, 553, 103

[56] References Cited

U.S. PATENT DOCUMENTS 5,200,654  4/1993  Archer ...................................... 327/362

*Primary Examiner*—Dinh Le
*Attorney, Agent, or Firm*—W. Daniel Swayze, Jr.; Wade James Brady, III; Richard L. Donaldson

[57] ABSTRACT

A hard disk drive system (10) has a read/write head (12) coupled to a read channel circuit (23) in an integrated circuit (13). The read channel circuit includes a bipolar transconductance-C filter (26) having at least one capacitor (27) with a capacitance value that may vary from an intended value. A temperature compensating voltage (VPTAT) is converted to a first current, a programming circuit (51) produces a second current (IPROG) as a function of the first current and a digital compensating input (54), and the second current is converted to a voltage (61) and used to control characteristics of the filter circuit. A trimming circuit (46) shunts away from the programming circuit a portion of the current generated by the voltage-to-current converter circuit, which portion is defined by a digital trim input (48).

14 Claims, 3 Drawing Sheets

METHOD AND APPARATUS FOR TRIMMING A SIGNAL

TECHNICAL FIELD OF THE INVENTION

This invention relates in general to a method and apparatus for trimming a signal and, more particularly, to a method and apparatus for trimming a signal which controls characteristics of a high frequency filter.

BACKGROUND OF THE INVENTION

A characteristic of high frequency bipolar transconductance-C filters is that the transconductance varies with temperature, and therefore the cutoff frequency varies with temperature. Accordingly, such a filter is typically supplied with an adjusting signal that adjusts the characteristics of the filter so as to compensate for operational variations which would otherwise occur as a result of temperature changes, thereby keeping the transconductance and cutoff frequency from changing due to temperature variations.

Such a filter will typically have one or more capacitors. When the filter is implemented in an integrated circuit, each capacitor of such a filter will have a capacitance that may vary from an intended value, due to the manufacturing process, and notwithstanding tight quality control procedures. Due to the fact that the capacitors on a given chip are all exposed to the same manufacturing process, the capacitance of each will tend to vary from an intended value by substantially the same percentage. Thus, the adjusting signal is usually trimmed in a manner which compensates for any deviation in capacitance. A further consideration is that, in certain applications, there is a need to intentionally and dynamically adjust the cutoff frequency of the filter, and this is typically implemented by intentionally modifying the adjusting signal so as to change the transconductance.

One application which involves all of these considerations is a hard disk drive system in which a read/write head is supported for approximately radial movement across the magnetic surface of a rotating disk, and in which a plurality of concentric tracks on the disk have different data densities. An output signal from the read/write head is coupled through a preamplifier to an integrated circuit, where it is supplied to a read channel circuit that includes a bipolar transconductance-C filter containing at least one capacitor. A known approach for generating an adjusting signal for such a filter is to take a temperature compensating voltage, which is varied with temperature to compensate for transconductance changes due to temperature changes, and to apply the temperature compensating voltage to a voltage-to-current converter circuit, which in turn applies the voltage across a resistor in order to generate a first current.

The first current is supplied to a PMOS programming circuit, which also receives a digital compensation input that represents the adjustment needed in the cutoff frequency of the filter in order to conform the filter to frequencies defined by the data density of the track with which the read/write head is currently aligned. The programming circuit generates a second current having a magnitude which is the magnitude of the first current scaled by a gain, the gain being defined by the digital compensation input. The second current is supplied to an NMOS trimming circuit, which also receives a digital trim input defining the adjustment needed in the filter as a result of any deviation of the capacitance of each filter capacitor from an intended capacitance. The trimming circuit generates a third current having a magnitude which is the magnitude of the second current scaled by a gain, the gain being defined by the digital trim input.

The third current needs to be converted to a voltage, but has a polarity opposite to the polarity needed by the input of a current-to-voltage converter circuit. The third current is therefore supplied to a PMOS mirror circuit, which generates a fourth current that is a mirror image of the third current. The fourth current is supplied to the current-to-voltage conversion circuit, the output of which is a voltage that serves as the adjusting signal to the filter. Although known arrangements of this type have been generally adequate for their intended purposes, they have not been satisfactory in all respects.

More specifically, the need to provide a PMOS current mirror circuit involves extra area and extra power consumption in the integrated circuit. Further, it is difficult to keep such a current mirror circuit operating where it has good noise rejection, and thus the current mirror circuit degrades the power supply rejection ratio (PSRR). Where the process is a 5-volt BiCMOS process that has only 3-volt CMOS, the use of an NMOS trimming circuit makes it necessary to provide logic level translators and to route the digital trim input signals through the translators before they are applied to inputs of the trimming circuit. The translators ensure that the digital inputs to the trimming circuit do not receive a voltage drop from a 5-volt supply which is greater than 3 volts and may damage the trimming circuit.

A further consideration is that the typical programming circuit implements a gain for the second current which is a factor of five or six times the first current, and the range of variation of the second current is further increased by changes in the temperature compensating voltage as a result of temperature variations. Thus, in this known arrangement, the trimming circuit and the current mirror circuit must both be designed to have the capability to handle a wide range of variation in the magnitude of the currents they handle, which increases the complexity, area and power consumption involved in implementing them in an integrated circuit. A further consideration is that the gain adjustment implemented by the NMOS trimming circuit is linear, whereas the capacitance variation for which it compensates is nonlinear.

SUMMARY OF THE INVENTION

From the foregoing, it will be appreciated that a need has arisen for a method and apparatus for trimming a signal, so as to provide reduced area and power consumption, so as to avoid the need for logical level translators, so as to provide nonlinear trimming, and so as to reduce the range of signal magnitudes which the trimming circuit must handle. According to the present invention, a method and apparatus are provided to address this need, and involve: applying a control voltage to a control input of a first transistor to cause a first current to flow between first and second terminals of the first transistor; selectively causing each of a plurality of second transistors to have an operational state which is one of an enabled state and a disabled state; and causing each second transistor which is in the enabled state to have a second terminal thereof operatively coupled to the second terminal of the first transistor, to have a first terminal thereof operatively coupled to a selected voltage, and to have a control input thereof operatively coupled to the control input of the first transistor, a second current being a sum of the currents flowing between the first and second terminals of each of the second transistors which are in the enabled state.

BRIEF DESCRIPTION OF THE DRAWINGS

A better understanding of the present invention will be realized from the detailed description which follows, taken in conjunction with the accompanying drawings, in which.

DETAILED DESCRIPTION OF THE INVENTION

Figure 1:
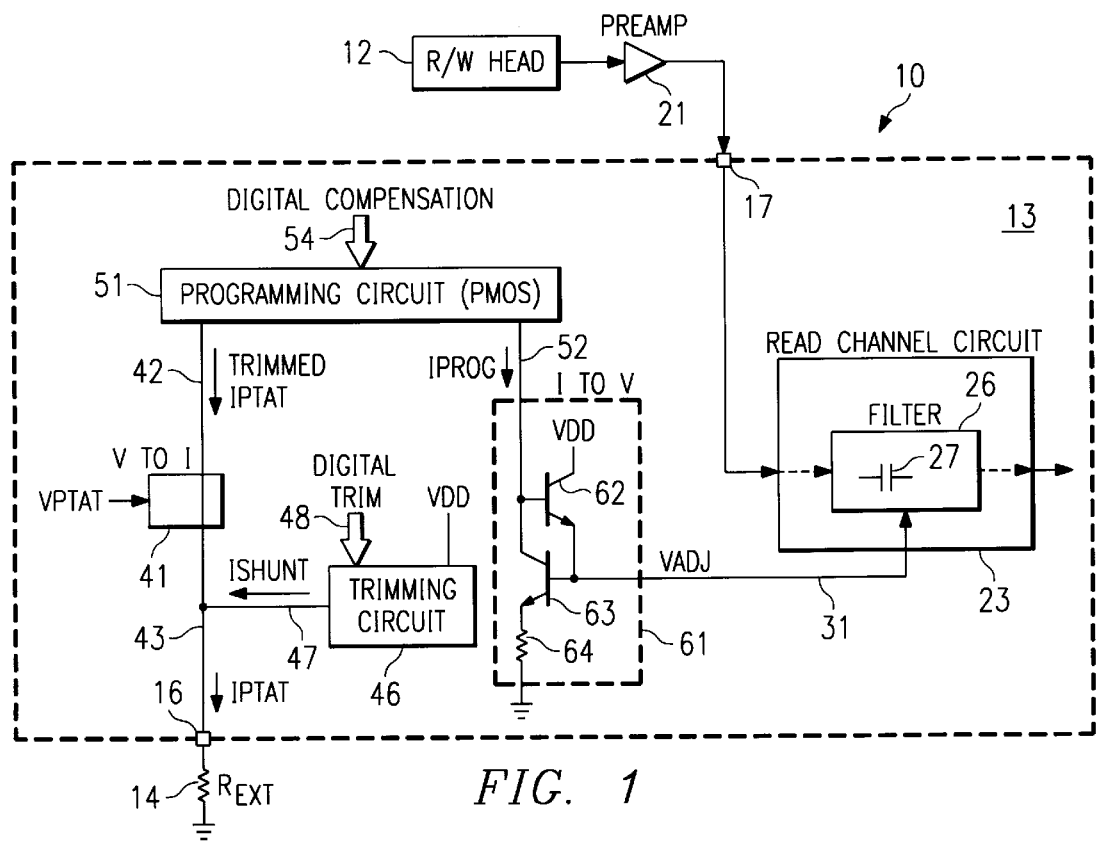
FIG. 1 is a block diagram of a hard disk drive system which embodies the present invention.

FIG. 1 is a diagrammatic view of part of a hard disk drive system 10 which embodies the present invention. Only the portions of the system 10 which are pertinent to an understanding of the present invention are illustrated and described.

The system 10 includes a read/write head 12, a preamplifier 21, an integrated circuit 13, and an external resistor 14. The integrated circuit 13 has a plurality of external connection pins, two of which are shown at 16 and 17. One end of the resistor 14 is coupled to external connection pin 16, and the other end is coupled to ground. The read/write head 12 is coupled to an input of the preamplifier 21, and the output of preamplifier 21 is coupled to the external connection pin 17 of the integrated circuit 13. The read/write head 12 thus supplies information to the integrated circuit 13 through the preamplifier 21 and the external connection pin 17.

The read/write head 12 is supported for radial movement adjacent the surface of a rotating magnetic disk, which is conventional and not illustrated. The read/write head 12 can write data to and read data and other information from a plurality of concentric tracks provided on the disk. More specifically, the read/write head 12 can read track identification information, sometimes referred to as servo wedge information, from each track on the disk, in order to facilitate positioning of the read/write head 12 relative to the disk.

The integrated circuit 13 includes a read channel circuit 23, which is of a conventional type known to those skilled in the art, and which has an input coupled to the external connection pin 17. The read channel circuit 23 includes a bipolar transconductance-C filter circuit 26, which is a conventional high frequency filter circuit of a type known to those skilled in the art. The circuitry within the filter 26 includes one or more capacitors, one of which is shown at 27. The filter 26 receives at 31 an adjusting voltage VADJ, which adjusts characteristics of the filter to compensate for three different factors.

First, bipolar transconductance-C filters such as filter 26 have a transconductance Gm, and therefore a cutoff frequency, which varies with temperature variations. The adjusting voltage at 31 is therefore varied to the extent necessary to keep the transconductance Gm and the cutoff frequency from changing as a result of temperature variations, in a manner described in more detail later.

Second, where the read/write head 12 is associated with a magnetic disk on which the radially inner tracks store less total data than the radially outer tracks, the signals representing information read from the disk have higher frequencies for outer tracks than for inner tracks. Therefore, the transconductance Gm of the filter 26 must be intentionally and dynamically adjusted in order to conform the cutoff frequency to the frequency range associated with the disk track with which the read/write head is currently aligned. Accordingly, the adjusting voltage at 31 is varied as a function of the radial position of the read/write head 12. This is also described in more detail later.

Figure 2:
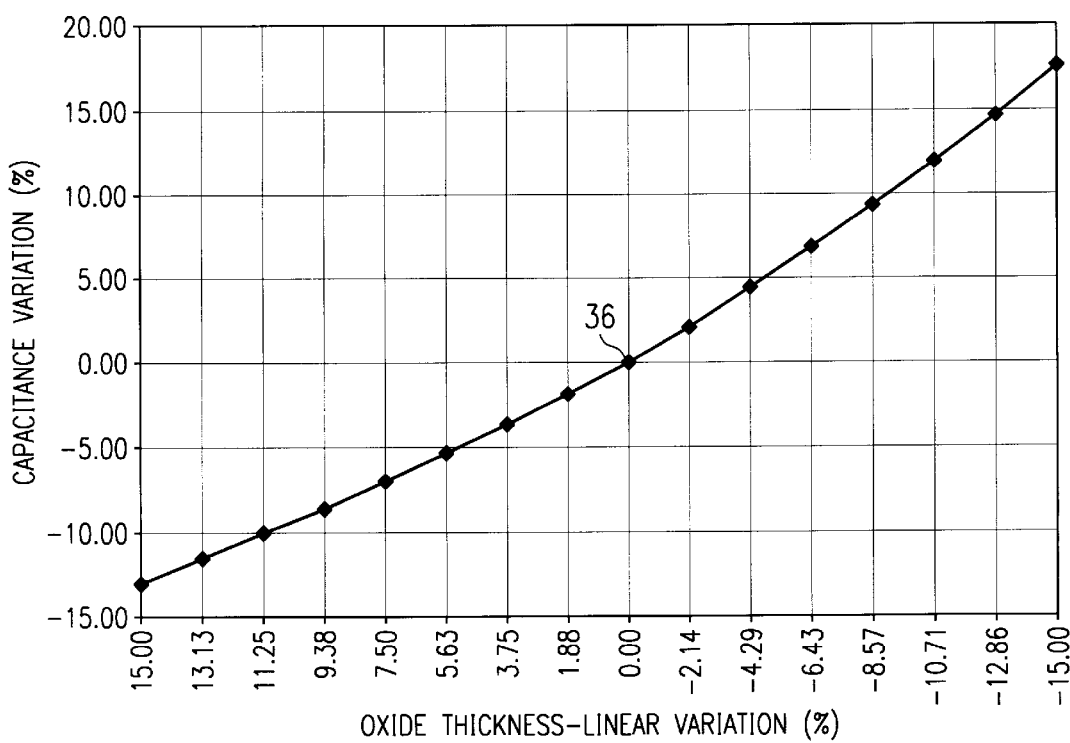
FIG. 2 is a graph relating to a capacitor in an integrated circuit which is part of the system of FIG. 1, and shows a variation in capacitance of the capacitor as a function of a variation in the thickness of an oxide layer.

Third, since the capacitor 27 is implemented in an integrated circuit, the actual capacitance of the capacitor 27 may vary from chip to chip as a result of the manufacturing process, notwithstanding tight quality control of the manufacturing process. This is due to variations in the thickness of an oxide layer in the capacitor structure. If there is more than one capacitor on the chip they will all tend to vary by the same percentage from respective intended values, because they will all have been exposed to the same manufacturing process. For purposes of this disclosure, one exemplary capacitor 27 is illustrated and described, but it should be remembered that the filter 26 may include additional capacitors subject to the same considerations. FIG. 2 is a graph showing a linear variation of the oxide thickness of capacitor 27 about a process mean 36, in particular from −15% to +15% of the process mean 36. In response to this linear variation in oxide thickness, the capacitance varies nonlinearly with respect to its process mean from about +17.5% to about −13%.

More specifically, the capacitance of the capacitor 27 varies according to the following formula:

$$c = \frac{\epsilon_0 \epsilon_r A}{d}$$

Where $\epsilon_0$ is the free space permutivity, $\epsilon_r$ is the relative permutivity, A is the area, and d is the distance between plates and thus the thickness of the oxide layer. As the term d is increased by 15% or decreased by 15%, the capacitance C varies nonlinearly, and in particular, changes from about +17.5% to about −13%.

The nonlinearity of the capacitance variation is self-evident from the curvature of the line drawn through the plotted points in FIG. 2. It will also be noted that the capacitance variation is assymetric about the process mean 36. As part of the manufacturing process, the actual capacitance of the capacitor 27 in each chip is determined, and the adjusting voltage at 31 is trimmed in a manner which substantially compensates for the variation of that particular capacitor from the process mean, in a manner described in more detail later.

The circuitry which generates the adjusting voltage VADJ at 31 will now be described. The integrated circuit 13 includes a conventional and not-illustrated circuit of a type known to those skilled in the art, which generates a proportional to absolute temperature voltage VPTAT. The voltage VPTAT could be supplied directly to the filter 26 in order to avoid changes in the transconductance of the filter 26 as a result of temperature changes. However, in the disclosed embodiment, the voltage VPTAT is first subjected to an adjustment which will cause the filter 26 to compensate for any variation of the particular capacitor 27 from an intended capacitance, and is then subjected to an adjustment which will cause the transconductance of the filter 26 to be adjusted to conform the cutoff frequency to the frequency range associated with the disk track currently radially aligned with the read/write head 12.

More specifically, the signal VPTAT is applied to the input of a voltage-to-current converter circuit 41, which facilitates a current flow between a line 42 and a line 43. The line 43 is coupled to the external connection pin 16. The voltageto-current converter circuit 41 effectively causes the voltage VPTAT to appear on the line 43, and thus to appear across the external resistor 14. Since I=V/R, for a given value of VPTAT the current IPTAT at 43 will be constant.

A trimming circuit 46 is coupled at 47 to the line 43, and has a digital input 48 which specifies the amount of trim needed to compensate for any process variation in the capacitance of capacitor 27. In general, the trimming circuit 46 effects a digital-to-analog conversion of the digital trim input 48, and then varies the amount of current ISHUNT flowing at 47 between the line 43 and a power supply VDD, in dependence on the value specified by the digital trim input 48. As mentioned above, for a given value of the voltage VPTAT, the current IPTAT is constant. It will therefore be recognized that the IPTAT current flowing at 43 is equal to the sum of the trimmed IPTAT current flowing at 42 and the shunt current ISHUNT flowing at 47. Stated differently, the trimmed IPTAT current flowing at 42 is the IPTAT current flowing at 43 less the shunt current flowing at 47. The circuitry and operation of the trimming circuit 46 will be described in more detail later.

The integrated circuit 13 also includes a programming circuit 51, which is of a conventional type known to those skilled in the art. The circuit 51 has two terminals which are respectively coupled to the line 42 and a line 52. The programming circuit 51 receives a digital compensation input at 54. The digital compensation input is generated in a manner which is conventional and known to those skilled in the art, and represents the compensation necessary to conform the transconductance and the cutoff frequency of filter 26 to the frequency range associated with the current radial position of the read/write head 12 with respect to the magnetic disk.

The programming circuit 51 is implemented using PMOS technology, and causes a current IPROG to flow in line 52 with a magnitude which is proportional to the magnitude of the trimmed IPTAT current flowing in line 42. More specifically, the programming circuit 51 effectively carries out a digital-to-analog conversion of the digital compensation input 54, and uses the result as a gain to be applied to the magnitude of the trimmed IPTAT current 42 in order to determine the magnitude to be implemented for the current IPROG at 52. The digital compensation input 54 can typically specify a gain factor of five or six, or in other words a magnitude for IPROG which is up to five or six times the magnitude of the trimmed IPTAT.

A current-to-voltage converter circuit 61 is also part of the integrated circuit 13, and has an input coupled to the line 52 and an output coupled to the line 31. The current-to-voltage converter circuit 61 includes a bipolar junction transistor 62 having a collector coupled to a supply voltage VDD, a base coupled to the line 52, and an emitter coupled to the line 31. A further bipolar junction transistor 63 has a collector coupled to the base of transistor 62, a base coupled to the emitter of transistor 62, and an emitter coupled to one end of a resistor 64, the other end of resistor 64 being coupled to ground. The current-to-voltage converter circuit 61 is responsive to the current IPROG, which is caused to flow at 52 by the programming circuit 51, and converts the current IPROG to a voltage which serves as the adjusting voltage VADJ provided on line 31 to the filter 26.

Figure 3:
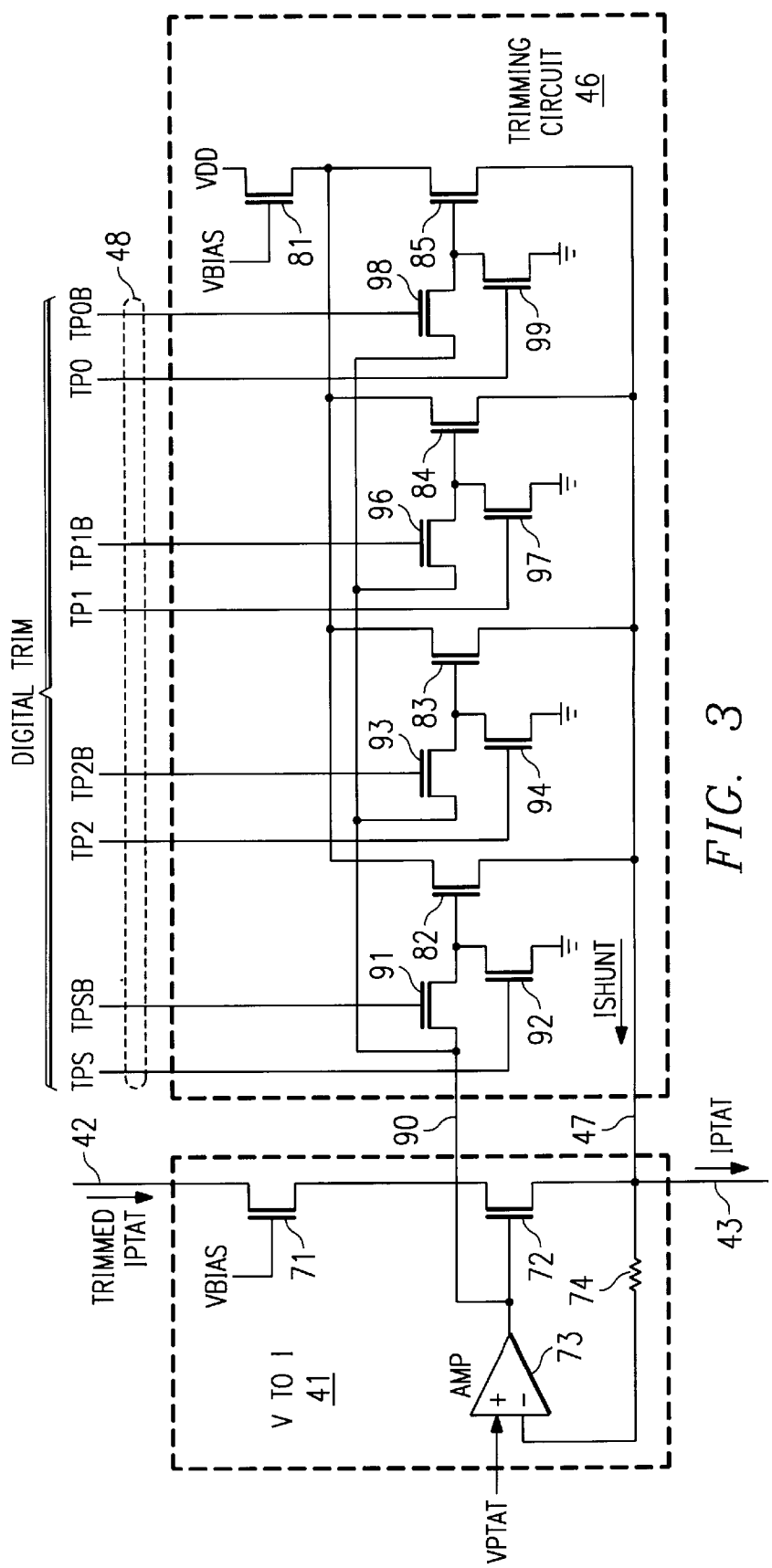
FIG. 3 is a circuit schematic of a trimming circuit and a voltage-to-current converter circuit which are components of the system of FIG. 1.

The voltage-to-current converter circuit 41 and the trimming circuit 46 are shown in more detail in FIG. 3. More specifically, with reference to FIG. 3, the voltage-to-current converter circuit 41 includes two field effect transistors 71 and 72, an operational amplifier 73, and a resistor 74. The transistors 71 and 72 are coupled in series between the lines 42 and 43. In particular, the drain of transistor 71 is coupled to line 42, the source of transistor 71 is coupled to the drain of transistor 72, and the source of transistor 72 is coupled to line 43. The gate of transistor 71 is coupled to a bias voltage VBIAS, which keeps the transistor 71 turned on. The transistor 71 ensures that the transistor 72 does not have a full supply voltage of 5 volts applied across it, especially during power down, and also improves the rejection ratio of the circuit. The gate of transistor 72 is coupled to the output of the operational amplifier 73. The input voltage VPTAT is applied to the positive input of the amplifier 73. The resistor 74 has its ends respectively coupled to the source of transistor 72 and the negative input of the amplifier 73.

In the system of FIG. 1, and as mentioned above, the voltage-to-current converter circuit 41 effectively causes the voltage VPTAT present at the positive input of amplifier 73 to appear on the line 43. The line 43 is coupled to an external connection pin 16. The purpose of resistor 74 is to protect the negative input of the operational amplifier 73 from damage in the event an electrostatic charge is externally applied to the external connection pin 16. In the disclosed embodiment, the transistor 72 actually includes thirty-eight substantially identical transistors which are coupled in parallel with each other, but which for purposes of convenience and clarity are all represented in FIG. 3 by a single transistor symbol.

The trimming circuit 46 includes a field effect transistor 81, which has a drain coupled to the supply voltage VDD, and which has a gate coupled to the bias voltage VBIAS in order to keep transistor 81 turned on. Four additional field effect transistors 82–85 each have a drain coupled to the source of transistor 81, and a source coupled to the line 47. The transistor 81 ensures that the transistors 82–85 do not have a full supply voltage of 5 volts applied across them, especially during power down, and also improves the rejection ratio of the circuit. The trimming circuit 46 further includes a pair of field effect transistors 91 and 92, which are associated with the transistor 82. The transistor 92 has its drain coupled to the gate of transistor 82, its source coupled to ground, and its gate coupled to a signal TPS from the digital trim input 48. The transistor 91 has its source coupled to the gate of transistor 82, its drain coupled at 90 to the gate of transistor 72, and its gate couple to a signal TPSB from the digital trim input 48. A further pair of transistors 93 and 94 is associated with the transistor 83 in a similar manner, the gates of transistors 94 and 93 being controlled by respective signals TP2 and TP2B from the digital trim input 48. In a similar manner, a pair of transistors 96 and 97 is associated with the transistor 84, the gates of transistors 97 and 96 being respectively coupled to signals TP1 and TP1B of the digital trim input 48. Moreover, a pair of transistors 98 and 99 is associated with the transistor 85, the gates of transistors 99 and 98 being respectively coupled to signals TP0 and TP0B of the digital trim input 48. The line 47 may be viewed as a trimming terminal or output of the trimming circuit 46, and the line 90 may be viewed as a control terminal or input of the trimming circuit 46. As mentioned above, the transistor 72 in the disclosed embodiment includes thirty-eight transistors which are substantially identical and which are coupled in parallel with each. In a similar manner, the transistor 85 in the disclosed embodiment includes a single transistor which is substantially identical to one of the transistors at 72. The transistor 84 is implemented with two transistors which are each substantially identical to one of the transistors at 72, and the transistor 83 is implemented with four transistors which are each substantially identical to one of the transistor at 72. The transistor 82 is implemented with eight transistor which are each substantially identical to one of the transistors at 72. It will be recognized that the transistors 82–85 thus have respective current flows which have a relative weighting or magnitude that corresponds to binary digits, where transistor 85 represents the least significant binary digit.

The digital trim input 48 may be viewed as a 3-bit signed binary number. The signal TP0 represents the least significant bit, the signal TP1 represents an intermediate bit, the signal TP2 represents the most significant bit, and the signal TPS is the sign bit. The signals TP0B, TP1B, TP2B and TPSB are respectively the complements of the signals TP0, TP1, TP2 and TPS.

With respect to the pair of transistors 91 and 92, since their gates are coupled to respective signals which are complements of each other, the transistor 91 is turned off when the transistor 92 is turned on, and the transistor 92 is turned off when the transistor 91 is turned on. When transistor 92 is turned on, the gate of transistor 82 is coupled to ground through the transistor 92, and thus the transistor 82 is turned off. Conversely, when the transistor 91 is turned on, the gate of transistor 82 is coupled through transistor 91 to the gate of transistor 72. Thus, the transistors 72 and 82 have their sources coupled together, and they also have their gates coupled together when the transistor 91 is turned on. Transistors 72 and 82 will therefore operate in parallel when the transistor 91 is turned on, the primary difference being that transistor 72 includes thirty-eight transistors and transistor 82 includes eight transistors, and thus the current flowing through transistor 72 will be several times larger than the current flowing through the transistor 82.

The pair of transistors 93 and 94 controls the transistor 83 in a similar manner, in that transistor 94 either couples the gate of transistor 83 to ground or the transistor 93 couples the gate of transistor 83 to the gate of transistor 72. The pair of transistor 96 and 97 effects a similar control of the gate of transistor 84, and the pair of transistors 98 and 99 effects a similar control of the gate of transistor 85. Each of the transistors 82–85 may be said to be in an enabled state when the associated transistor 91, 93, 96 or 98 is turned on, and in a disabled state when the associated transistor 92, 94, 97 or 99 is turned on. The shunt current ISHUNT flowing at 47 is, of course, the sum of the currents through the subset of transistors 82–85 that are currently enabled. As mentioned above, the trimming circuit 46 adjusts for a process variation in the capacitance of capacitor 27. For a given integrated circuit, the capacitance of the capacitor 27 may deviate from the process norm, but will not thereafter change dynamically. Thus, for a given integrated circuit, the capacitance of the capacitor 27 can be determined at the end of the manufacturing process, the appropriate setting for the digital trim input 48 can be determined, and the digital trim input 48 can then be permanently set for that integrated circuit. In the disclosed embodiment, each of the eight signals shown in FIG. 3 for the digital trim input 48 is set in a permanent manner using conventional and not-illustrated fusable links that are provided in the integrated circuit. Alternatively, fusable links could be used to selectively and permanently disconnect the source of any of the transistors 82–85 from the line 47, or to disconnect the gate of any of the transistors 82–85 from being operationally coupled to the gate of transistor 72. It would then be possible to eliminate the transistor pairs which include transistors 91–94 and 96–99. As still another alternative approach, it will be recognized that the integrated circuit could include a register which has its outputs coupled to the digital trim input 48, and which is loaded after power-on with an appropriate digital value to control the digital trim input 48 so as to effect an appropriate trimming effect that compensates for the particular capacitance variation in that specific integrated circuit.

As explained above, the transistors 72 and 82–85 are each implemented with one or more transistors that are all substantially identical. In particular, the transistor 72 includes thirty-eight transistors coupled in parallel with each other, the transistor 82 includes eight transistors coupled in parallel with each other, the transistor 83 includes four transistors coupled in parallel with each other, the transistor 84 includes two transistors coupled in parallel with each other, and the transistor 85 includes a single transistor. Thus, it will be recognized that, depending on whether each of the transistors 82–85 is enabled or disabled by the signals of the digital trim input 48, the trimmed IPTAT current flowing at 42 will be:

$$\text{Trimmed } IPTAT = IPTAT\left(\frac{38}{38+X}\right)$$

where IPTAT is the current flowing at 43, and X is the total number of actual transistors implementing the subset of transistors 82–85 that are currently enabled, where X can vary from 0 to 15. That is, in determining X, transistor 82 is weighted at 8 if enabled, transistor 83 is weighted at 4 if enabled, transistor 84 is weighted at 2 if enabled, and transistor 85 is weighted at 1 if enabled.

In the filter 27, the cutoff frequency $f_c$ is proportional to the transconductance Gm divided by the capacitance C:

$$f_c \propto \frac{G_m}{C}$$

Figure 4:
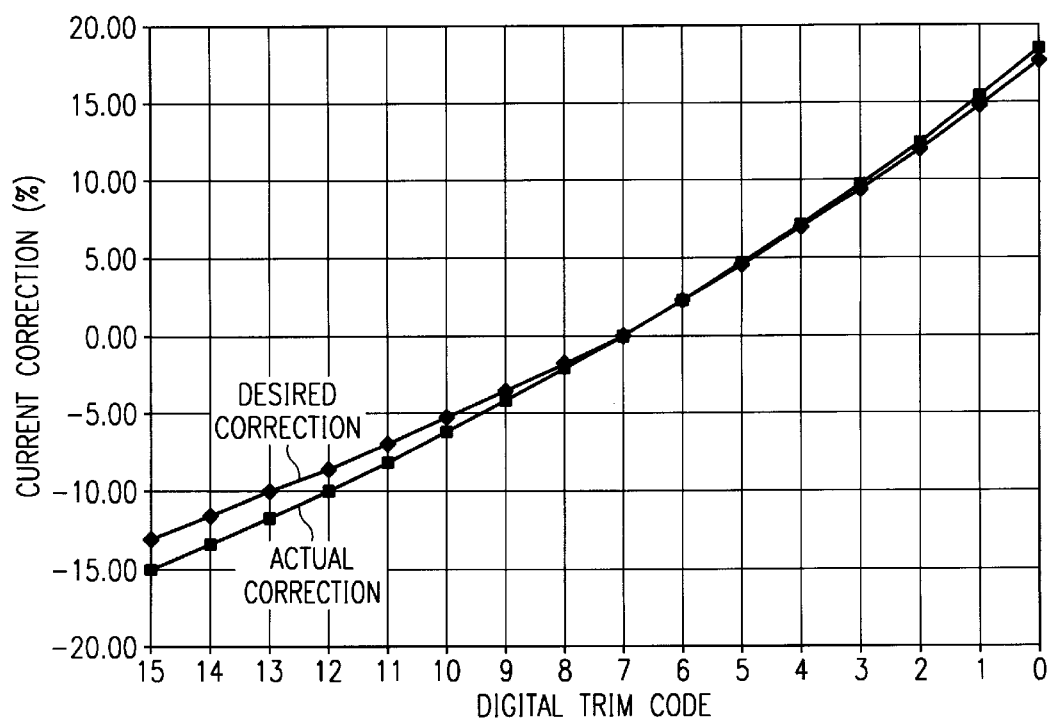
FIG. 4 is a graph relating to the trimming circuit of FIG. 3, showing desired and actual current corrections as a function of a digital trim code.

Thus, in order to accurately maintain a desired cutoff frequency, the change implemented by the trimming circuit 46 in the transconductance Gm must have the same nonlinear variation as the capacitance C. FIG. 4 is a graph which shows the desired correction or trim in the current in order to cause the transconductance Gm to exhibit the same nonlinear variation as the capacitance C. As mentioned above, the trimming circuit 46 in the disclosed embodiment effects trimming according to the equation.

$$\text{Trimmed } IPTAT = IPTAT\left(\frac{38}{38+X}\right)$$

In this equation, it will be noted that the trimmed current IPTAT varies in inverse proportion to the denominator of (38+X) on the right side, where X is defined by the digital trim input 48. FIG. 4 shows this as the actual correction provided by the disclosed embodiment, and it will be noted that the actual correction is a nonlinear curve which closely approximates the nonlinear curve of the desired correction. The nonlinear shape of the curve for the actual correction can be adjusted by changing the number of actual transistors used to implement the transistor 72, or by changing the number of actual transistors used to implement one or more of the transistors 82–85. The effectiveness of the nonlinear compensation is optimized by appropriate selection of the number of actual transistors, the number of bits in the digital trim input 48, and the value of the digital trim input 48 which corresponds to the process mean, or in other words a nominal adjustment for the capacitance.

In the disclosed embodiment, and as evident from FIG. 4, the digital trim input 48 for the trimming circuit 46 has a value of seven for a nominal capacitance adjustment, namely when a particular capacitor 27 has a capacitance which is substantially equal to the capacitance that it was intended to have. Positive or negative compensation for capacitance variation is then possible by setting the digital trim input 48 to a value higher than seven or lower than seven. As mentioned above, the 4-bit digital trim input 48 can be viewed as a signed 3-bit number, in which case the 4-bit codes representing 0 to 15 would respectively correspond to signed numbers of +7 to 0 and −1 to −8.

The present invention provides numerous technical advantages. One such technical advantage is the elimination of the need for a PMOS current mirror circuit to turn around the current from a trimming circuit in order to obtain a current polarity compatible with a current-to-voltage converter. Elimination of the current mirror circuit reduces the area and power consumption needed in an integrated circuit, and also avoids the degradation of the power supply rejection ratio (PSRR) associated with the use of a typical current mirror circuit. A further technical advantage is that the trimming circuit is not coupled across the supply voltage in series with another circuit, such as a programming circuit or current mirror circuit, and its design is thus not constrained like the known trimming circuit by a limited amount of voltage headroom. Yet another advantage is that the trimming circuit can be controlled by 3 volt CMOS logic in a 5 volt BiCMOS process, avoiding any need to provide logical level translators for its digital control inputs.

A further technical advantage is that the trimming circuit according to the invention does not need the capability to handle a range of current variation which is at least five or six times the trimmed current. Still another technical advantage is that the trimmed circuit effects nonlinear compensation for a characteristic which varies non-linearly.

Although one embodiment has been illustrated and described in detail, it should be understood that various changes, substitutions and alterations can be made therein without departing from the scope of the present invention. For example, the disclosed embodiment sets the digital trim input to the trimming circuit using fusable links, but it will be recognized that the trimming circuit could alternatively be customized in a given integrated circuit by using fusable links to selectively effect or interrupt a coupling between transistors of the trimming circuit and other circuit components, or by providing a register which controls the digital trim inputs and which is loaded with a value that effects the needed trim. Further, where the disclosed embodiment utilizes multiple transistors coupled in parallel to implement a particular transistor function, it will be recognized that the specific number of transistors used to implement any particular transistor function may be varied. Moreover, although the disclosed embodiment involves a trimming circuit in the particular context of a bipolar transconductance-C filter of a hard disk drive, it will be recognized that the invention is suitable for use in other applications where a signal must be trimmed.

It should also be recognized that the direct connections disclosed herein could be altered, such that two disclosed components or elements are coupled to one another through an intermediate device or devices without being directly connected, while still realizing the present invention. Other changes, substitutions and alterations are also possible without departing from the spirit and scope of the present invention, as defined by the following claims.

What is claimed is:

1. An apparatus, comprising:
   a first transistor, said first transistor having a control input to which a control voltage is applied, having first and second terminals, and having a first current flowing between said first and second terminals; and
   a trimming circuit, said trimming circuit including:
   a trimming terminal which is coupled to said second terminal of said first transistor;
   a control terminal coupled to said control input of said first transistor;
   a plurality of second transistors which each have a control input and have first and second terminals, said trimming circuit being operative to selectively cause each of said second transistors to have an operational state which is one of an enabled state and a disabled state, each said second transistor which is in the enabled state having the second terminal thereof operatively coupled to said trimming terminal, having the first terminal thereof operatively coupled to a voltage, and having the control input thereof operatively coupled to said control terminal, a second current flowing at said trimming terminal being the sum of currents flowing between said first and second terminals of each of said second transistors which are in the enabled state.

2. An apparatus according to claim 1, further a circuit which is coupled to said second terminal of said first transistor and which is operative to cause a current flow therethrough in response to a voltage at said second terminal of said first transistor, said predetermined current being a sum of said first and second currents.

3. An apparatus according to claim 1, wherein said second transistors are arranged in groups, and all said second transistors in each said group have the same operational state.

4. An apparatus according to claim 1, wherein said second transistors are arranged in groups, all said second transistors in each said group have the same state.

5. An apparatus according to claim 1, wherein said trimming circuit has a digital control input that further includes signals determining which of said second transistors are to have the disabled state and which of said second transistors are to have the enable stated.

6. An apparatus according to claim 1, wherein said trimming circuit includes a digital control input having signals specifying which of said second transistors are to have the enabled state and which of said second transistors are to have the disabled state, and further includes a plurality of transistor pairs, each said transistor pair including a third transistor and a fourth transistor, said third transistor being coupled between said control terminal and said control inputs of a respective group of said second transistors, and said fourth transistor being coupled between ground and the control inputs of the second transistors of the respective group, said third and fourth transistors having control inputs coupled to respective signals of said digital control input which are complements of each other.

7. An apparatus according to claim 1, wherein said trimming circuit includes a digital control input having signals determining which of said second transistors are to have the enabled state and which of said second transistors are to have the disabled state.

8. An apparatus according to claim 1, further including a third transistor coupled in series with said first transistor and having a control input coupled to a bias voltage that turns on said third transistor, and wherein said trimming circuit includes a fourth transistor coupled in series with each of said second transistors, said fourth transistor having a control input which is coupled to a bias voltage that turns on said fourth transistor.

9. An apparatus according to claim 1, further including:

a programming circuit having a digital compensation input, said programming circuit being responsive to said first current for generating the second current having a magnitude which is a function of said digital compensation input;

a current-to-voltage converter circuit for converting said second current to an output voltage; and a transconductance-C filter which is implemented in an integrated circuit and which is operative to adjust the transconductance of said filter in response to the output voltage from said current-to-voltage converter circuit.

10. A method comprising the steps of:

providing a first transistor which has a control input, which has first and second terminals, and which has a first current flowing between said first and second terminals;

applying a control voltage to the control input of said first transistor;

providing a plurality of second transistors which each have a control input and first and second terminals;

selectively causing each of the second transistors to have state which is one of an enabled state and a disabled state; and causing each of the second transistors which is in the enabled state to have the second terminal thereof operatively coupled to the second terminal of the first transistor, to have the first terminal thereof operatively coupled to a voltage, and to have the control input thereof operatively coupled to the control input of the first transistor, wherein a second current is a sum of the currents flowing between the first and second terminals of each of the second transistors which are in the enabled state.

11. A method according to claim 10, further including the step of forming a sum of the first current and a second current to be substantially constant for a value of the control voltage.

12. A method according to claim 10, further including the step of arranging the second transistors in groups which each include a different number of the second transistors; and imparting to all of the second transistors in each group the same operational state.

13. A method according to claim 10, further including the steps of:

providing a digital control input determining which of the second transistors are to have the enabled state and which of the second transistors are to have the disabled state; and causing the second current to vary nonlinearly in response to linear variations in the binary number represented by the digital control input.

14. A method according to claim 10, further including the step of controlling the transconductance of a transconductance-C filter as a function of variations in the first current.

* * * * *